United States Patent
Serizawa (10) Patent No.: US 10,342,123 B2
(45) Date of Patent: Jul. 2, 2019

(54) PRINTED BOARD AND IMAGE FORMING APPARATUS

(71) Applicant: CANON KABUSHIKI KAISHA, Tokyo (JP)

(72) Inventor: Shinsuke Serizawa, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/792,355

(22) Filed: Oct. 24, 2017

(65) Prior Publication Data

US 2018/0049317 A1 Feb. 15, 2018

Related U.S. Application Data

(60) Division of application No. 15/142,197, filed on Apr. 29, 2016, now Pat. No. 9,844,132, which is a
(Continued)

(30) Foreign Application Priority Data

Jan. 30, 2014 (JP) .................. 2014-015751

(51) Int. Cl.
*H05K 1/02* (2006.01)
*G03G 15/00* (2006.01)
(Continued)

(52) U.S. Cl.
CPC ........... *H05K 1/0296* (2013.01); *G03G 15/50* (2013.01); *G03G 15/80* (2013.01);
(Continued)

(58) Field of Classification Search
CPC .............. G03G 21/1652; H05K 3/222; H05K 2201/10363; H05K 2201/0394
See application file for complete search history.

(56) References Cited

U.S. PATENT DOCUMENTS

| 4,657,325 A | 4/1987 | Marks et al. |
|---|---|---|
| 5,923,917 A | 7/1999 | Sakurai et al. |

(Continued)

FOREIGN PATENT DOCUMENTS

| CN | 1605951 A | 4/2005 |
|---|---|---|
| JP | S60-063965 U | 5/1985 |

(Continued)

OTHER PUBLICATIONS

Chinese Office action dated May 18, 2017 in Chinese Application No. 201510053882.2.
(Continued)

*Primary Examiner* — Clayton E. LaBalle
*Assistant Examiner* — Jas A Sanghera
(74) *Attorney, Agent, or Firm* — Venable LLP (57) ABSTRACT

The printed board includes a slit portion and a first conductive member that is provided straddling the slit portion. In a state in which the printed board is attached to an apparatus to which one end of a second conductive member having an elastic force is connected, another end of the second conductive member contacts the first conductive member, and the another end of the second conductive member passes through the slit portion.

23 Claims, 6 Drawing Sheets

Related U.S. Application Data continuation of application No. 14/601,720, filed on Jan. 21, 2015, now Pat. No. 9,360,814.

(51) Int. Cl.
    *H05K 1/11*     (2006.01)
    *H05K 3/40*     (2006.01)
    *G03G 21/16*     (2006.01)

(52) U.S. Cl.
    CPC ....... *G03G 21/1652* (2013.01); *H05K 1/0269* (2013.01); *H05K 1/117* (2013.01); *H05K 3/403* (2013.01); *H05K 3/4015* (2013.01); *H05K 2201/0394* (2013.01); *H05K 2201/09063* (2013.01); *H05K 2201/09181* (2013.01); *H05K 2201/10287* (2013.01); *H05K 2201/10363* (2013.01)

(56) References Cited

U.S. PATENT DOCUMENTS

| | | | |
|---|---|---|---|
| 6,026,266 A | 2/2000 | Sakai et al. | |
| 6,238,221 B1 | 5/2001 | Ikeda et al. | |
| 7,181,152 B2 | 2/2007 | Kuma et al. | |
| 7,864,024 B2 | 1/2011 | Schlenker et al. | |
| 9,360,814 B2 * | 6/2016 | Serizawa | G03G 15/50 |
| 9,844,132 B2 * | 12/2017 | Serizawa | H05K 1/0296 |
| 2002/0048466 A1 | 4/2002 | Sameshima | |
| 2012/0003016 A1 | 1/2012 | Uchiyama et al. | |

FOREIGN PATENT DOCUMENTS

| | | | |
|---|---|---|---|
| JP | S61-078195 A | 4/1986 | |
| JP | 2002-158408 A | 5/2002 | |
| JP | 2005-019506 A | 1/2005 | |
| JP | 2005-19506 A | 1/2005 | |
| JP | 2005-353546 A | 12/2005 | |
| JP | 2008-41551 A | 2/2008 | |
| JP | 4273851 B2 * | 6/2009 | ............. G03G 15/00 |
| JP | 4273851 B2 | 6/2009 | |
| JP | 2010-103312 A | 5/2010 | |

OTHER PUBLICATIONS

Japanese Office Action dated Nov. 22, 2016 in Japanese Application No. 2014015751.

Japanese Office Action dated Jan. 9, 2018 in Japanese Application No. 2017038769.

\* cited by examiner

PRINTED BOARD AND IMAGE FORMING APPARATUS

This application is a division of U.S. patent application Ser. No. 15/142,197, filed on Apr. 29, 2016, which is a continuation of U.S. application Ser. No. 14/601,720, filed on Jan. 21, 2015, (now U.S. Pat. No. 9,360,814, issued on Jun. 7, 2016), the contents of each of which are incorporated herein by reference.

BACKGROUND OF THE INVENTION

Field of the Invention

The present invention relates to a printed board and an image forming apparatus that is equipped with the printed board.

Description of the Related Art

An image forming apparatus such as a laser beam printer includes a charge device, a developing device, a transfer device and a fixing device. The charge device charges the surface of a photosensitive member to a uniform charge. The developing device develops a latent image that is formed on the photosensitive member by a laser beam or the like with toner. The transfer device transfers the developed toner image on the photosensitive member onto a transfer material. In addition, the fixing device includes a heater that is driven by an alternating current power supply, and heats the toner image that was transferred onto the transfer material to thereby fix the toner image on the transfer material.

A high voltage of several hundred volts to several kilovolts is applied to the charge device, the developing device and the transfer device. In order to supply a high voltage to these devices, the image forming apparatus is equipped with a high-voltage power supply board (hereunder, referred to as "power supply board") having a high-voltage power supply circuit that generates a high voltage on a printed board. In a case where the power supply board and the main body of the image forming apparatus are connected using a high voltage cable in order to apply a high voltage generated by the power supply board to the charge device, the developing device and the transfer device, the assemblability is poor and costs are incurred in providing the high voltage cable. Therefore, for example, in Japanese Patent Application Laid-open No. 2002-158408, a method is proposed that connects a power supply board and the main body of an image forming apparatus without using a high voltage cable. That is, a conductive contact portion is provided on the power supply board, a coiled spring member is provided on the image forming apparatus main body side, and the power supply board is installed in the main body of the image forming apparatus. By this means, the contact portion on the power supply board and the coiled spring member on the image forming apparatus main body side come in contact, and a high voltage is applied to the image forming apparatus main body side. In addition, in Japanese Patent Application Laid-open No. 2002-158408, a configuration is adopted in which a hole is provided for confirming whether or not the spring member is contacting the contact portion of the power supply board after the power supply board has been installed in the main body of the image forming apparatus, and thus the state of contact therebetween can be visually checked.

However, according to the above described method that uses a coiled spring member to connect a power supply board provided inside an image forming apparatus and a contact point for input of a high voltage on the apparatus side, if the diameter of a coil portion of the spring member is reduced, the area thereof that contacts the printed board decreases. Consequently, when pushing the printed board against the spring member and fixing the printed board in that state, the contact state is unstable, and there is a high possibility that the spring member will be deformed. If the coil portion of the spring member is deformed, the coil portion will no longer precisely contact a circuit pattern on the power supply board side. Therefore, the diameter of the coil portion cannot be easily reduced. Consequently, there is the problem that the proportion of the area occupied by the contact point with respect to the overall power supply board increases, and this leads to an increase in the substrate area. Furthermore, there are many cases where a plurality of places that connect a power supply board and the main body of an image forming apparatus are provided, and in which a configuration is adopted so that a pressure contact force of a predetermined amount or more is applied to the contact portions to cause the respective contact portions to reliably contact. When installing the power supply board in the main body of the image forming apparatus, the power supply board directly receives a repulsive force of the spring member, and because the amount of force required when installing the power supply board increases as the number of contact portions increases, there is the problem that the assembly workability is poor.

In addition, there is also the problem that, depending on the size and quality of the material of the power supply board as well as the number of contact points, the power supply board itself may be bent by the repulsive force of the spring member, and stress may be applied to components that are mounted on the power supply board by such bending. Further, when visually checking the contact state through a hole for visual confirmation as described in the aforementioned Japanese Patent Application Laid-Open No. 2002-158408, one part of the spring member can be checked visually. However, there is also a problem that it is not possible to visually check whether a contact portion of the power supply board and a coil of the spring member securely contact each other.

SUMMARY OF THE INVENTION

The present invention has been made in view of the above described circumstances, and enables a reduction in an area required for a contact portion, a decrease in a force that is necessary at the time of assembly, as well as easy performance of a visual check of a contact portion.

According to the present invention there is provided a printed board on which a circuit that generates a voltage is mounted, including: a slit portion, and a first conductive member that is provided straddling the slit portion, wherein, in a state in which the printed board is attached to an apparatus to which one end of a second conductive member having an elastic force is connected, another end of the second conductive member contacts the first conductive member.

According to the present invention there is provided an image forming apparatus including a printed board on which a circuit for supplying a voltage is mounted, and a process member for forming an image, to which a voltage generated in the circuit of the printed board is supplied; wherein: the printed board includes a first conductive member that is provided straddling a slit; one end of a second conductive member having an elastic force is connected to the process member; and in a state in which the printed board is attached to the image forming apparatus, another end of the second conductive member contacts the first conductive member.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

Embodiment 1

Configuration of Image Forming Apparatus

Figure 1:
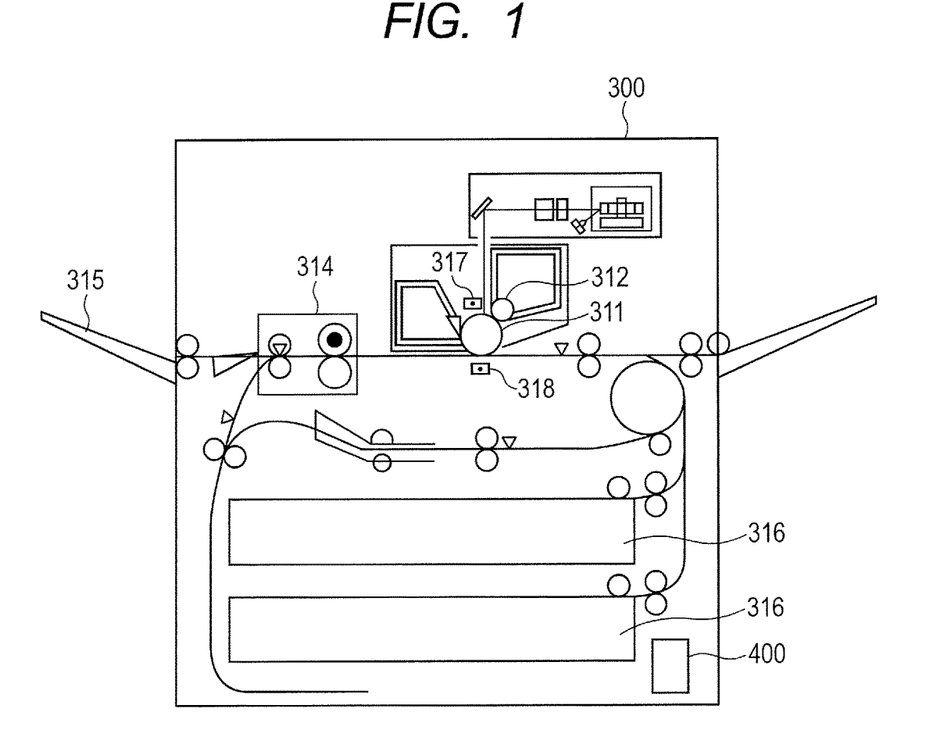
FIG. 1 is a view illustrating the external appearance of an image forming apparatus according to Embodiments 1 to 5.

A laser beam printer is described hereunder as one example of an image forming apparatus according to Embodiment 1. FIG. 1 illustrates the schematic configuration of a laser beam printer that is one example of a printer adopting an electrophotographic system. A laser beam printer 300 includes a photosensitive member 311 that is an image bearing member on which an electrostatic latent image is formed, a charge device 317 (charge unit) that charges the photosensitive member 311 to a predetermined potential, and a developing device 312 (developing unit) that develops an electrostatic latent image formed on the photosensitive member 311 with toner. A toner image that was developed on the photosensitive member 311 is then transferred by a transfer device 318 (transfer unit) onto a sheet (not illustrated in the drawings) as a recording material that is supplied from a cassette 316, the toner image that was transferred onto the sheet is fixed by a fixing member 314, and the sheet is discharged to a tray 315. The photosensitive member 311, charge device 317, developing device 312, and transfer device 318 constitute an image forming unit. The laser beam printer 300 also includes a power supply apparatus 400. Note that although the image forming apparatus illustrated in FIG. 1 includes one image forming unit, an image forming apparatus to which the present embodiment is applied is not limited to the image forming apparatus illustrated as an example in FIG. 1, and for example may be an image forming apparatus that includes a plurality of image forming units. In addition, the present embodiment may be applied to an image forming apparatus that includes a primary transfer device that transfers a toner image formed on the photosensitive member 311 onto an intermediate transfer belt, and a secondary transfer device that transfers the toner image on the intermediate transfer belt onto a sheet.

The laser beam printer 300 also includes a controller, which is not illustrated in the drawings, that controls image forming operations by the image forming unit as well as operations to convey a sheet. The power supply apparatus 400, for example, supplies electric power to the controller. The power supply apparatus 400 also supplies electric power to a driving device such as a motor for rotating the photosensitive member 311 or various rollers that convey a sheet. Further, a high-voltage power supply printed board (hereunder, also referred to as "power supply board"), which is not illustrated in the drawings, that generates a high voltage is installed in each of the charge device 317, the developing device 312 and the transfer device 318, and a configuration is adopted so that a required high voltage is supplied at a time of charging, developing, and transferring.

Configuration of Contact Portion

Figure 2A:
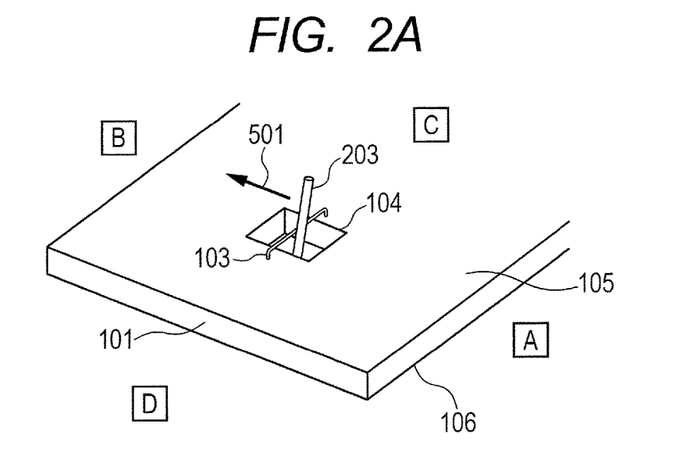
FIG. 2A is a view illustrating the configuration of a contact point on a printed board of Embodiment 1.
Figure 2B:
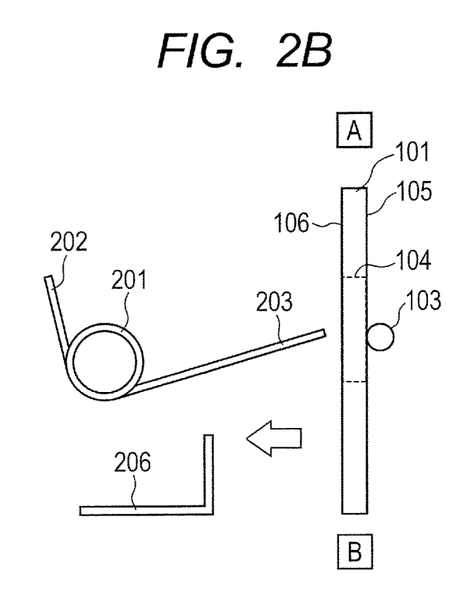
FIGS. 2B and 2C are views illustrating states of the contact point before and after attachment to the apparatus.
Figure 2C:
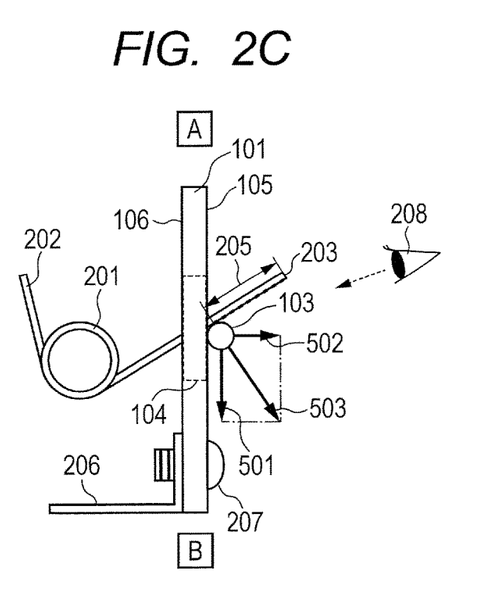

FIGS. 2A to 2C are views for describing a contact portion between a charging high-voltage output portion of the power supply board that supplies a high voltage to the charge device 317 and a spring member that is a conductive member that conducts a high voltage to the charge device 317 in the present embodiment. Although a power supply board that supplies a high voltage to the charge device 317 is taken as an example in the following description, a similar configuration is also adopted for other high-voltage power supply units, for example, a developing high-voltage output portion that supplies a high voltage to the developing device 312 or a transfer high-voltage output portion that supplies a high voltage to the transfer device 318. In addition, a high voltage is also applied in the following cases. For example, in the case of using a roller-shaped transfer roller (not illustrated in the drawings) as a transfer device, a high voltage for removing (cleaning) toner as a developer that adhered to the transfer roller is applied to the transfer roller. Further, a charge eliminating voltage (high voltage) for separating from the photosensitive member a sheet onto which an image was transferred by means of the transfer roller and the photosensitive member is applied to a charge eliminating device (not illustrated in the drawings). A high voltage is also applied to a sensor (metal plate) provided in a toner container for detecting the remaining amount of toner inside the container that contains toner. In addition, a high voltage is applied to a blade as a toner charge member for charging toner when performing development. Furthermore, if the configuration is that of a color image forming apparatus, a high voltage is applied to a primary transfer roller as a primary transfer device when performing primary transfer of a toner image from a photosensitive member to an intermediate transfer member. A high voltage is also applied to a secondary transfer roller as a secondary transfer device when performing secondary transfer of the toner image from the intermediate transfer member to a sheet.

FIG. 2A is a perspective view illustrating a contact portion between a jumper wire 103 that is a charging high-voltage output portion provided in a printed board 101 that is a power supply board and an arm portion 203 on the printed board 101 side of a torsion coil spring that is an electrically conductive spring member that conducts a high voltage to the charge device 317. In FIG. 2A, the jumper wire 103 that functions as a contact member (first conductive member) is provided straddling a slit 104 that is a through hole (also referred to as "notch portion") that is provided penetrating through a component surface 105 and a solder surface 106 of the printed board 101. A power supply circuit, which is not illustrated in the drawings, on the printed board 101 is connected to the jumper wire 103, and a high voltage generated in the power supply circuit is applied to the jumper wire 103. Although the jumper wire 103 is provided on the component surface 105 side on which circuit components are mounted, a leg portion, which is not illustrated in the drawings, of the jumper wire 103 passes through the component surface 105 and the solder surface 106 of the printed board 101. Therefore, the jumper wire 103 may be connected to a power supply circuit, which is not illustrated in the drawings, on the component surface 105 side or on the solder surface 106 side. Further, as long as the jumper wire 103 is connected to the power supply circuit, which is not illustrated in the drawings, on the surface on which the jumper wire 103 is provided, the leg portion of the jumper wire need not necessarily pass through the printed board 101.

Further, in the following embodiments also, although the jumper wire 103 is mounted on the component surface 105 side, the jumper wire 103 may be mounted on the solder surface 106 side that is the surface on the opposite side of the printed board 101 to the component surface 105.

Note that, hereunder, the component surface 105 and the solder surface 106 are referred to simply as a surface 105 and a surface 106, respectively. In addition, the surface 105 may be the solder surface and the surface 106 may be the component surface, or the printed board 101 may be a single-sided substrate in which a component surface and a solder surface are the surface 105 or the surface 106.

In addition, a pressure 501 that is indicated by an arrow in the drawings indicates the direction of an applied pressure that is parallel to the surfaces 105 and 106 of the printed board 101 that is applied when the arm portion 203 of the torsion coil spring that functions as a contact member (second conductive member) comes into contact with the jumper wire 103. Further, reference characters A, B, C and D in FIG. 2A are provided to show the correspondence with the position of the printed board 101 in FIG. 2B and FIG. 2C.

Attachment of Printed Board to Apparatus

FIG. 2B and FIG. 2C are views that illustrate the state of the contact portion before and after attaching the printed board 101 to an apparatus (an electrical equipment, including an image forming apparatus, is referred to simply as "apparatus") that is a body to be attached to. FIG. 2B illustrates a state before attaching the printed board 101 to the apparatus, and FIG. 2C illustrates a state after attaching the printed board 101 to the apparatus. In the present embodiment, the term "body to be attached to" refers to the charge device 317. FIG. 2B and FIG. 2C are side views in a case where the contact portion and the printed board 101 are viewed from the C side to the D side shown in FIG. 2A when the printed board 101 in a state in which the A side and B side shown in FIG. 2A are the upper side and lower side, respectively, and the component surface 105 is the right side and the solder surface 106 is the left side in FIG. 2B and FIG. 2C. Further, the arm portion 203 that is one end of the coil portion 201 of the torsion coil spring is an arm portion on the printed board 101 side, and an arm portion 202 that is another end of the coil portion 201 of the torsion coil spring is an arm portion on the charge device 317 side. The arm portion 202 is connected to a high-voltage input portion, not illustrated in the drawings, of the charge device 317, which applies a charging voltage to a charging roller, which is not illustrated in the drawings, that charges the photosensitive member 311.

FIG. 2B is a side view of the printed board 101 that shows the state of the printed board 101 before being attached to the apparatus. An outline arrow in FIG. 2B indicates the direction of attaching the printed board 101 to the charge device 317 on the apparatus side. By attaching the printed board 101 in the direction of the outline arrow, the arm portion 203 of the torsion coil spring passes through the slit 104 (broken line portion in the drawing) while rubbing against the jumper wire 103. Further, the surface 106 of the printed board 101 contacts against a fixing member 206 for fixing the printed board 101 to the apparatus main body. More specifically, the configuration is one in which the surface 106 of the printed board 101 contacts against the fixing member 206, and the jumper wire 103 of the printed board and the arm portion 203 of the torsion coil spring come in contact.

FIG. 2C is a side view of the printed board 101 that illustrates a state after the printed board 101 is attached to the apparatus. As shown in FIG. 2B and FIG. 2C, when attaching the printed board 101 to the charge device 317, a worker moves the printed board 101 from the position shown in FIG. 2B to the position shown in FIG. 2C. The worker then passes a screw 207 through a hole, not illustrated in the drawings, that is provided in the printed board 101 and fixes the printed board 101 to the fixing member 206 of the charge device 317 by fastening the screw 207 thereto. Further, while the worker is moving the printed board 101 towards the fixing member 206, the jumper wire 103 is rubbed by a section 205 of the arm portion 203 of the torsion coil spring that passes through the slit 104. As a result of the portion of the jumper wire 103 that contacts with the arm portion 203 of the torsion coil spring being rubbed, a wiping effect is produced by which foreign matter such as dust on the contact portion is rubbed off, and thus the reliability of the contact point can be improved.

In the present embodiment, a power supply circuit, which is not illustrated in the drawings, on the printed board 101 is connected to the jumper wire 103, and a high voltage generated in the circuit is applied to the jumper wire 103. In the state in FIG. 2C, a high voltage generated in the power supply circuit, which is not illustrated in the drawings, is supplied to the charge device 317 through the jumper wire 103 and the arm portion 203, the coil portion 201 and the arm portion 202 of the torsion coil spring.

As shown in FIG. 2C, a contact pressure (a pressure 503 indicated by an arrow in the drawings) produced by an elastic force of the torsion coil spring is applied to the jumper wire 103 from the arm portion 203 of the torsion coil spring.

By this means, the electrical connection between the jumper wire 103 and the arm portion 203 of the torsion coil spring is ensured. Note that, a force applied to the jumper wire 103 from the arm portion 203 by the elastic force of the torsion coil spring is at an angle with respect to the surface 105 of the printed board 101. Consequently, as shown in FIG. 2C, as viewed from the printed board 101, the pressure 503 that is indicated by an arrow in the drawing can be divided into a pressure 501 in the horizontal direction and a pressure 502 in the vertical direction. When the worker attaches the printed board 101 to apparatus as shown in FIG.

2B and FIG. 2C, a force that the worker receives from the torsion coil spring through the printed board 101 when performing the attachment work is the pressure 502 in the vertical direction. In order to ensure the electrical connection, the pressure 502 that is in the vertical direction with respect to the surface 105 of the printed board 101 is a smaller pressure than the pressure 503 that is required at the contact point that is the pressure applied to the jumper wire 103 that is a point which the torsion coil spring contacts. Accordingly, by constructing the contact portion in the manner described in the present embodiment, when attaching the printed board 101 to apparatus in the vertical direction, it is possible to perform the attachment under the pressure 502 that is weaker than the pressure 503 that is the force required at the contact portion, and thus the assembly workability can be improved.

Further, when the jumper wire 103 and the arm portion 203 of the torsion coil spring that are illustrated in FIG. 2C are electrically connected, the arm portion 203 of the torsion coil spring passes through the slit 104 of the printed board 101. If a situation arises in which the arm portion 203 of the torsion coil spring becomes caught on the surface 106 side of the printed board 101 and does not pass through the slit 104 of the printed board 101, the arm portion 203 of the torsion coil spring will not protrude from the slit 104. Therefore, since it can be determined that the torsion coil spring is in contact with the jumper wire 103 if the worker can check by eyesight (denoted by reference numeral 208 in FIG. 2C) that the arm portion 203 of the torsion coil spring passes through the slit 104, it is easy to perform a visual check of the contact portion. Further, as described above, in the contact portion in the configuration of the present embodiment, since the jumper wire 103 that is a contact point can be provided on either of the component surface and the solder surface of the printed board 101, the degree of freedom with respect to the layout of components of the printed board 101 can be improved.

The present embodiment has been described taking as an example a case in which a torsion coil spring is used as a member that connects the printed board 101 and a high-voltage feeding portion of the charge device 317 of the apparatus. Since the contact portion is constituted by the jumper wire 103 and the linear arm portion 203 of the torsion coil spring, the area required for the contact portion can be reduced in comparison to the conventional method that causes the actual coil of the spring member to contact a jumper wire.

Note that, to prevent electrical discharge by the high voltage that is applied to the contact portion, in the case of arranging components around the contact portion it is necessary to arrange the components at a distance that corresponds to the value of the high voltage and to provide a region in which arrangement of components is prohibited. Since the area required for the contact portion decreases, a region in which the arrangement of components is prohibited around the contact portion provided on the printed board 101 can be reduced, and hence an effect of reducing the area of the printed board 101 is obtained.

Further, although a torsion coil spring is used as a connecting member in the present embodiment, a connecting member is not limited thereto, and an electrically-conductive member that has an elastic structure such as, for example, a leaf spring may also be used. With respect to the jumper wire also, the present invention is not limited to a linear member such as the jumper wire 103 of the present embodiment, and for example a tabular metal member may also be used. In addition, the shape of the slit is not limited to a quadrilateral shape, and for example the slit may be a circular shape, an elliptical shape, or a polygonal shape. Further, although in the present, embodiment the reference characters A and B are described as denoting sides in the vertical direction of the printed board 101, and the reference characters C and D are described as denoting sides in the horizontal direction of the printed board 101, the sides A and B may be sides in the horizontal direction of the printed board 101 and the sides C and D may be sides in the vertical direction of the printed board 101.

As described in the foregoing, according to the present embodiment, an area required for a contact portion can be decreased and a force that is necessary at the time of assembly can be reduced, and visual checking of the contact portion can also be easily performed.

Embodiment 2

In Embodiment 1, an embodiment was described in which a slit that is a through hole is provided in the inner part of a printed board. In Embodiment 2, an embodiment will be described in which a slit is provided at an edge of the printed board.

Configuration of Contact Portion

Figure 3A:
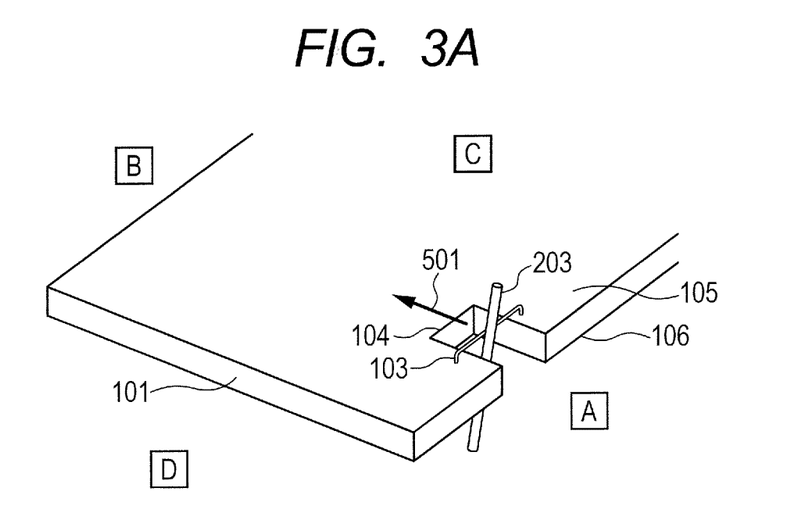
FIG. 3A is a view illustrating the configuration of a contact point of Embodiment 2.

FIG. 3A is a perspective view illustrating a contact portion between the juniper wire 103 that is provided in the printed board 101 and the arm portion 203 on the printed board 101 side of the torsion coil spring. In FIG. 3A, components that are the same as in FIG. 2A of Embodiment 1 are denoted by the same reference symbols. Hereunder, a difference with respect to the configuration illustrated in FIG. 2A of Embodiment 1 will be described, and a description of the same configuration as in FIG. 2A is omitted.

The difference between the configuration illustrated in FIG. 3A of the present embodiment and the configuration illustrated in FIG. 2A of Embodiment 1 is as follows. That is, in FIG. 2A a configuration is adopted in which the slit 104 is a through hole that is provided in the inner part of the printed board 101. In contrast, in FIG. 3A, the slit 104 is provided at the edge of the printed board 101, and one side of the slit 104 is an edge of the printed board 101, that is, an opening portion, and the slit 104 is formed by notching an edge of the printed board 101. Therefore, as shown in FIG. 3A, the slit 104 has a shape that is recessed from an edge of the printed board 101 so as to form the opening portion.

In the present embodiment, by providing the contact portion at the edge of the printed board 101, a region in which the arm portion 203 of the torsion coil spring passes through the slit 104 when attaching the printed board 101 to the apparatus side can be located on the outward side of the printed board 101. Thus, the area that the slit 104 occupies on the printed board 101 can be reduced, and consequently a region in which arrangement of components is prohibited around the contact portion can be reduced. Hence the area of the printed board 101 can itself be decreased.

Figure 3B:
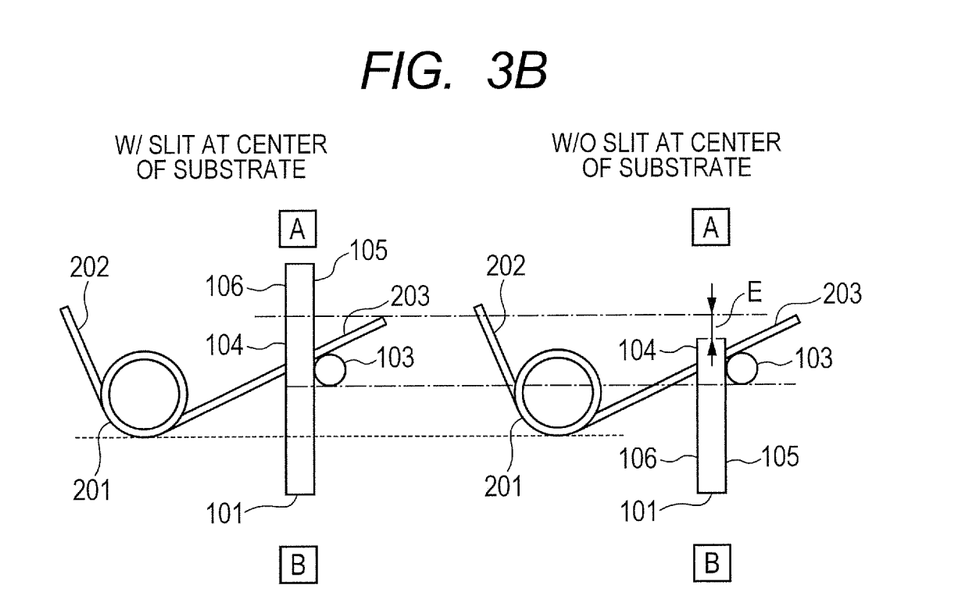
FIG. 3B is a view for describing a difference arising in accordance with the presence of a slit with respect Embodiments 1 and 2.

Hereunder, an effect obtained by providing the slit 104 at the edge of the printed board 101 will be described using FIG. 3B. FIG. 3B is a side view showing the printed board 101 in a case where the slit 104 is provided at the center of the printed board 101 as in Embodiment 1 (drawing on the left side in FIG. 3B), and a case where the slit 104 is provided at the edge of the printed board 101 and not at the center thereof as in the present embodiment (drawing on the right side in FIG. 3B). Hatching portions indicated by diagonal lines in FIG. 3B represent the slit 104. Note that the drawing on the right side in FIG. 3B illustrates a case where the length of the slit 104 in an A-B direction in the drawing is short. Further, in FIG. 3B, a chain double-dashed line indicates a range in the A-B direction of the slit 104 in the case of Embodiment 1 (drawing on the left side in FIG. 3B). In comparison with the slit 104 of Embodiment 1 that is shown on the left side in FIG. 3B, the length in the A-B direction of the printed board 101 of the slit 104 of the present embodiment that is shown on the right side in FIG. 3B is shorter by an amount E that is indicated by arrows. In the present embodiment, the arm portion 203 of the torsion coil spring can contact the jumper wire 103 in a state in which the arm portion 203 protrudes from the slit 104 by the amount E. Further, the slit 104 has an opening portion at the edge of the printed board 101. Therefore, for example, even in a case where the arm portion 203 of the torsion coil spring does not enter the slit 104 and is caught at the edge on the A side of the printed, board 101, the arm portion 203 can be guided into the slit 104 via the opening portion that is a notch portion provided in the edge of the printed board 101.

As described above, according to the present embodiment, an area required for a contact portion can be decreased and a force that is necessary at the time of assembly can also be reduced, and visual checking of the contact portion can be easily performed. In particular, by providing the slit at the edge of the printed, board, the area required for the slit can be further reduced.

Embodiment 3

In Embodiments 1 and 2, embodiments were described of a case in which a single contact portion is provided in the printed board. According to Embodiment 3, an embodiment is described of a case where two contact portions are provided in the printed board.

Configuration of Contact Portion

Figure 4A:
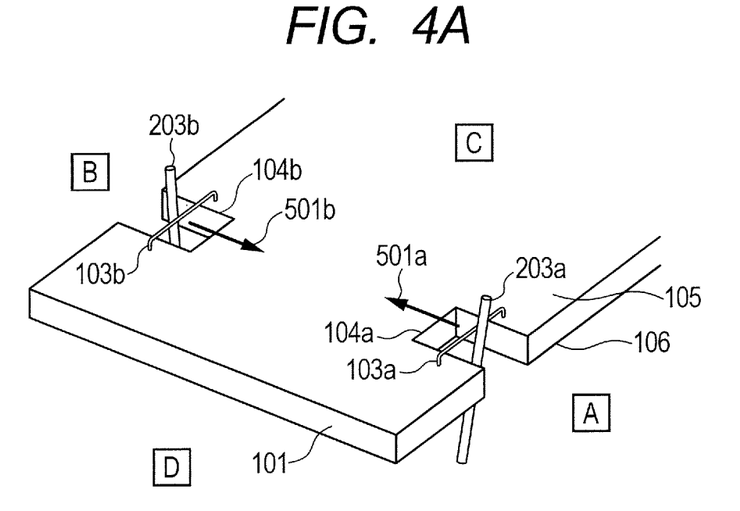
FIG. 4A is a view illustrating the configuration of contact points of Embodiment 3.
Figure 4B:
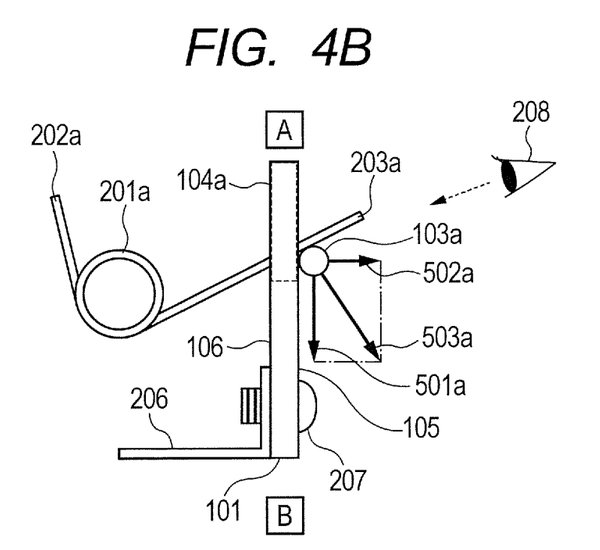
FIG. 4B is a view for describing the directionality of forces applied to the contact points.

FIG. 4A is a perspective view illustrating contact portions between jumper wires 103a and 103b provided on the printed board 101 and arm portions 203a and 203b on the printed board 101 side of torsion coil springs. Although the configuration illustrated in FIG. 4A is similar to the configuration illustrated in Embodiment 2, the present embodiment differs from Embodiment 2 in the respect that two contact portions are provided in the present embodiment in contrast to the single contact portion provided in Embodiment 2. FIG. 4B is a side view illustrating a contact portion at which the arm portion 203a of a torsion coil spring contacts the jumper wire 103a, and the printed board 101. In FIG. 4A and FIG. 4B, pressures 501a and 501b that are indicated by arrows represent pressures in the horizontal direction (A-B direction) of the printed board 101 among the pressures that the arm portions 203a and 203b of the torsion coil springs apply to the jumper wires 103a and 103b. Further, the pressure 501a and a pressure 502a that are shown in FIG. 4B are a horizontal direction component and a vertical direction component of a pressure 503a, respectively, as viewed, from, the printed board 101. Slits 104a and 104b are provided at two edges that oppose each other in the A-B direction of the printed board 101. Further, the pressures 501a and 501b that are applied to the jumper wires 103a and 103b by the torsion coil springs act in opposite directions (inverse directions) to each other in the horizontal direction (A-B direction). By this means, the electrical connections at the contact portions are made more secure.

In the case of electrically connecting the torsion coil springs and the jumper wires in the above described configuration, the pressure 503a and a pressure 503b (not illustrated in the drawings) of arm portions 203a and 203b of the torsion coil springs are applied to the printed board 101 through the jumper wires 103a and 103b. The pressure 503a and the pressure 503b (not illustrated in the drawings) are set so that a predetermined pressure is applied to ensure the reliability of contact between the torsion coil springs and the jumper wires 103a and 103b at the contact portions. Therefore, similarly to the present embodiment, pressure amounts applied by the torsion coil springs to the printed board are the same at contact points between the torsion coil spring and the jumper wire 103 in Embodiments 1 and 2 also.

Further, according to the above described configuration, similarly to Embodiment 1, a force that arises when attaching the printed board 101 to the apparatus main body is dispersed, and thus the force that arises when attaching the printed board 101 to the apparatus main body can be made a small force and bending of the printed board 101 can be reduced. That is, if the printed board 101 is bent, stretching occurs on the surface of the printed board 101. Since stress arises at the land of soldered parts and at solders and circuit components on the printed board 101 as the result of the occurrence of stretching, the stretching is a factor that causes cracks and ruptures. Therefore, when bending of the printed board 101 can be reduced as in the present embodiment, cracks and ruptures that arise in the land of soldered parts of components mounted on the substrate can be decreased, and the assembly workability when attaching the printed board 101 to the apparatus can be improved.

Although a case in which the number of contact portions is two has been described as an example in the present embodiment, the number of contact portions is not limited to two. For example, since a force that is necessary at a time of assembly is also reduced in a case where the printed board 101 has a plurality of contact portions and, among the plurality of contact portions, there are one or more sets of contact points for which the positions of the edges at which the contact portions are provided oppose each other, the present invention is also applicable to a case where the printed board has contact points at two or more places. Further, although the slits 104 are provided at edges in the present embodiment, the configuration of the present embodiment can also be applied in a case where a plurality of slits are provided in an inner part of the printed board 101 as in Embodiment 1.

As described above, according to the present embodiment, an area required for a contact portion can be decreased and a force that is necessary at the time of assembly can be reduced, and visual checking of the contact portion can also be easily performed.

Embodiment 4

The torsion coil spring described in Embodiments 1 to 3 is electrically connected with a jumper wire at one portion. In Embodiment 4, a torsion coil spring that is electrically connected with a jumper wire at a plurality of places will be described.

Configuration of Contact Portion

Figure 5A:
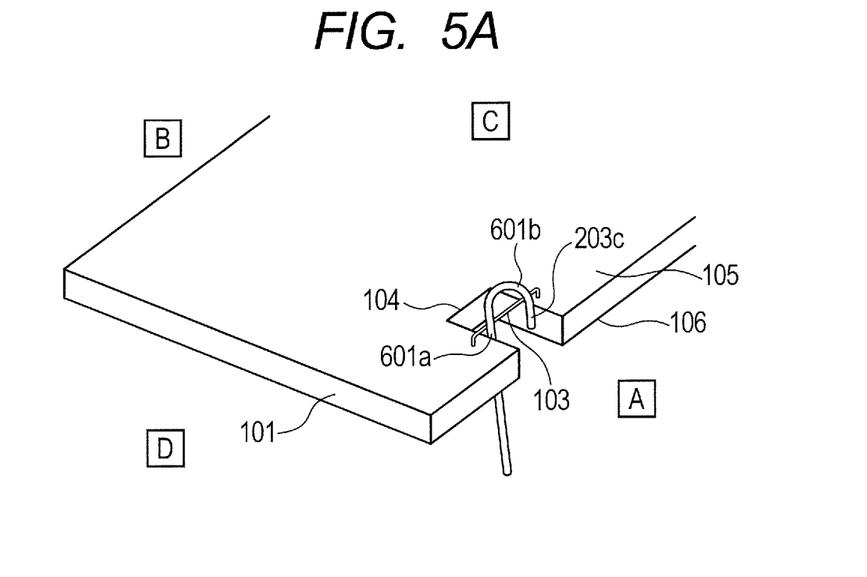
FIG. 5A is a view illustrating the configuration of a contact point of Embodiment 4.
Figure 5B:
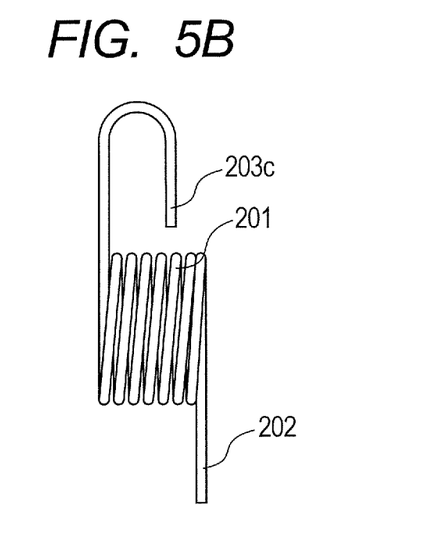
FIG. 5B is a view illustrating the shape of a torsion coil spring.

FIG. 5 A is a perspective view illustrating a contact portion between the jumper wire 103 that is provided in the printed board 101 and an arm portion 203c on the printed board 101 side of a torsion coil spring. In FIG. 5A, components that are the same as in FIG. 2A of Embodiment 1 are denoted by the same reference symbols. Hereunder, a difference with respect to the configuration illustrated in FIG. 2A of Embodiment 1 will be described, and a description of the same configuration as in FIG. 2A is omitted. FIG. 5B is a view that illustrates the shape of the torsion coil spring of the present embodiment. In FIG. 5A, the arm portion 203c of the torsion coil spring is electrically connected at two places with the jumper wire 103, that is, at a first contact point 601a and a second contact point 602b as two contact points. By this means, in comparison to a method in which the torsion coil spring contacts the jumper wire 103 at one portion as described in Embodiments 1 to 3, the method in which the torsion coil spring contacts the jumper wire 103 at a plurality of place as in the present embodiment increases the area of contact therebetween, and hence contact failures decrease and the reliability of the contact portion can be improved.

FIG. 5B illustrates the shape of the torsion coil spring of the present embodiment. The torsion coil spring shown in FIG. 2B and FIG. 2C of Embodiment 1, FIG. 3B of Embodiment 2 and FIG. 4B of Embodiment 3 is illustrated in the drawings in a state in which the torsion coil spring is rotated 90 degrees in the horizontal direction. In the torsion coil spring illustrated in FIG. 5B, the arm portion 203 is formed in a "U" shape by folding back the distal end portion of the arm portion 203 of the torsion coil spring shown in Embodiments 1 to 3. Further, by additionally folding back the arm portion 203 by 90 degrees to the arm portion 202 side, the arm portion 203c of the present embodiment can be created. When the torsion coil spring having the arm portion 203c is used, the arm portion 203c of the torsion coil spring can contact the jumper wire 103 at two places. Note that, as shown in FIG. 5A, the width of the U-shaped portion of the arm portion 203c is narrower than the width of the slit 104 in the direction of the jumper wire 103 (C-D direction). Further, the shape of the arm portion 203c is not limited to a "U" shape, and a similar effect is obtained as long as the arm portion 203c has a shape such that the arm portion 203c is folded back at a predetermined angle at one or more places (may also be folded back at multiple places). Although in the present embodiment the number of contact points between the torsion coil spring and the jumper wire 103 is two, the number of contact points is not limited to two. For example, the reliability of the contact portion can be further improved by increasing the number of times that the arm portion 203c of the torsion coil spring is folded back to thereby increase the number of contact points with the jumper wire 103. The torsion coil spring of the present embodiment can also be applied with, respect to the torsion coil springs of Embodiments 1 to 3.

As described above, according to the present embodiment, an area required for a contact portion can be decreased and a force that is necessary at the time of assembly can be reduced, and visual checking of the contact portion can also be easily performed.

Embodiment 5

Although in Embodiments 2 and 3, the slit 104 provided at an edge of the printed board 101 is formed in a channel shape, in Embodiment 5 a configuration is described in which the opening portion at the edge of the printed board 101 of the slit 104 is formed in a broadened shape.

Configuration of Contact Portion

Figure 6:
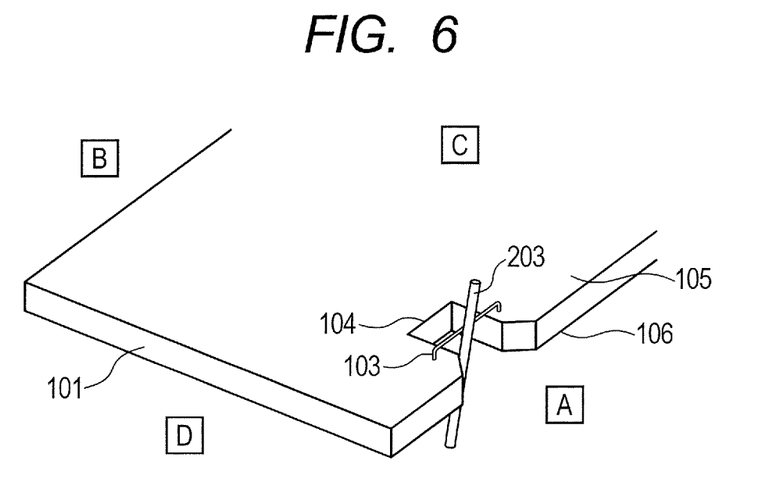
FIG. 6 is a view illustrating the configuration of a contact point of Embodiment 5.

FIG. 6 is a perspective view illustrating a contact portion between the jumper wire 103 that is provided in the printed board 101 and an arm portion 203 on the printed board 101 side of a torsion coil spring. In FIG. 6, components that are the same as in FIG. 2A of Embodiment 1 are denoted by the same reference symbols. Hereunder, a difference with respect to the configuration illustrated in FIG. 2A of Embodiment 1 will be described, and a description of the same configuration as in FIG. 2A is omitted. As shown in FIG. 6, the basic structure of the slit 104 is the same as in Embodiment 2. A difference between the present embodiment and Embodiment 2 is that, while the slit in the printed board 101 of Embodiment 2 is formed in a channel shape, an opening portion in the C-D direction on the edge side of the printed board 101 in the present embodiment is formed in a broadened "Y" shape. Note that, the shape of the slit 104 is not limited to a "Y" shape, and as long as the opening portion of the edge side of the slit 104 is broadened, the slit 104 may be, for example, a "V" shape.

By adopting the structure of the slit 104 of the present embodiment illustrated in FIG. 6, since the opening portion on the edge side of the printed board 101 is broadened, the arm portion 203 of the torsion coil spring can be guided (drawn in) over a wider area than in the case of the channel-shaped slit 104 illustrated in Embodiment 2. That is, even if the position of the arm portion 203 of the torsion coil spring deviates from the position of the slit 104, guiding of the arm portion 203 of the torsion coil spring into the slit 104 via the opening portion can be performed more easily than in the case illustrated in Embodiment 2. By this means, when attaching the printed board 101 to the apparatus side, the amount which serves to draw the arm portion 203 into the slit 104 increases, and a contact failure that is caused by a deviation between the attachment position of the printed board 101 and the arm portion 203 of the torsion coil spring can be prevented. Note that, the structure of the slit 104 of the present embodiment can also be applied with respect to the slits 104a and 104b of Embodiment 3. Further, the shape of the arm portion 203 of the torsion coil spring of the present embodiment may also be a "U" shape as in the case of the arm portion 203c described in Embodiment 4.

As described above, according to the present embodiment, an area required for a contact portion can be decreased and a force that is necessary at the time of assembly can be reduced, and visual checking of the contact portion can also be easily performed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-015751, filed Jan. 30, 2014, which is hereby incorporated by reference herein in its entirety.

What is claimed is:

1. A printed board on which a circuit is mounted, comprising:
an opening recessed from an edge surface of the printed board; and
a first conductive member connected to the printed board and bridged over the opening, the first conductive member having a contact portion that comes into contact with a second conductive member extending in a direction making an angle with regard to a surface perpendicular to the edge surface of the printed board, wherein the contact portion is provided on a side of the edge surface of the printed board of the first conductive member.

2. The printed board according to claim 1, wherein the first conductive member comes into contact with the second conducive member in a state where the printed board is fixed onto an apparatus on which the printed board is mounted.

3. The printed board according to claim 1, wherein the first conductive member is a wire-shaped element and the second conductive member is a coiled spring member having a linear-shaped arm, and
wherein the contact between the first conductive member and the second conductive member is made by contact between the wire-shaped element and the linear-shaped arm.

4. The printed board according to claim 3, wherein the coiled spring member has an elasticity to provide a predetermined pressure onto the first conductive member.

5. The printed board according to claim 1, wherein the first conductive member is connected the circuit mounted on the printed board.

6. The printed board according to claim 1, wherein the contact portion is positioned at a portion where the second conductive member contacts the first conductive member on the side of the edge surface of the printed board of the first conductive member.

7. The printed board according to claim 1, wherein, in a state where the second conductive member contacts the contact portion, the second conductive member provides a first pressure in a direction perpendicular to a surface of the printed board, a second pressure in a direction parallel to the surface of the printed board, and a third pressure in a direction angled with the directions perpendicular and parallel to the surface of the printed board, to the first conductive member.

8. An apparatus comprising:
a printed board mounted on the apparatus, wherein a circuit is mounted on the printed board; and
a fixing member configured to fix the printed board onto the apparatus,
the printed board including
an opening recessed from an edge surface of the printed board;
a first conductive member connected to the printed board and bridged over the opening; and
a second conductive member, one end of the second conductive member connected to the apparatus and another end of the second conductive member extending in a direction making an angle with regard to a surface perpendicular to the edge surface of the printed board,
wherein the first conductive member has a contact portion that comes into contact with the second conductive member and the contact portion is provided on a side of the edge surface of printed board of the first conductive member.

9. The apparatus according to claim 8, wherein the first conductive member comes into contact with the second conducive member in a state where the printed board is fixed onto an apparatus on which the printed board is mounted.

10. The apparatus according to claim 8, wherein the first conductive member is a wire-shaped element and the second conductive member is a coiled spring member having a linear-shaped arm, and
wherein the contact between the first conductive member and the second conductive member is made by contact between the wire-shaped element and the linear-shaped arm.

11. The apparatus according to claim 10, wherein the coiled spring member has an elasticity to provide a predetermined pressure onto the first conductive member.

12. The apparatus according to claim 8, wherein the first conductive member is connected to the circuit mounted on the printed board.

13. The apparatus according to claim 8, wherein the contact portion is positioned at a portion where the second conductive member contacts the first conductive member on the side of the edge surface of the printed board of the first conductive member.

14. The apparatus according to claim 8, wherein, in a state where the second conductive member contacts the contact portion, the second conductive member provides a first pressure in a direction perpendicular to a surface of the printed board, a second pressure in a direction parallel to the surface of the printed board, and a third pressure in a direction angled with the directions perpendicular and parallel to the surface of the printed board, to the first conductive member.

15. An image forming apparatus comprising:
an image forming unit configured to form an image;
a printed board configured to supply a voltage to the image forming unit, the printed board mounted on the image forming apparatus, wherein a circuit is mounted on the printed board; and
a fixing member configured to fix the printed board onto the apparatus,
the printed board including:
an opening recessed from an edge surface of the printed board;
a first conductive member connected to the printed board and bridged over the opening; and
a second conductive member, one end of the second conductive member connected to the apparatus and another end of the second conductive member coming into contact the first conductive member, the second conductive member extending in a direction making an angle with regard to a surface perpendicular to the edge surface of the printed board,
wherein the first conductive member has a contact portion that comes into contact with the second conductive member and the contact portion is provided on a side of the edge surface of printed board of the first conductive member.

16. The apparatus according to claim 15, wherein the first conductive member comes into contact with the second conducive member in a state where the printed board is fixed onto an apparatus on which the printed board is mounted.

17. The apparatus according to claim 15, wherein the first conductive member is a wire-shaped element and the second conductive member is a coiled spring member having a linear-shaped arm, and
wherein the contact between the first conductive member and the second conductive member is made by contact between the wire-shaped element and the linear-shaped arm.

18. The apparatus according to claim 17, wherein the coiled spring member has an elasticity to provide a predetermined pressure onto the first conductive member.

19. The apparatus according to claim 15, wherein the first conductive member is connected to the circuit mounted on the printed board.

20. The apparatus according to claim 15, further comprising an image bearing member configured to form an electrostatic latent image, wherein the image forming unit includes either of a charge unit configured to charge the image bearing member with a predetermined potential, a developing unit configured to develop the electrostatic latent image with toner to form a toner image, a transfer unit configured to transfer the toner image on the image bearing member onto a sheet, a cleaning unit configured to clean the transfer unit, a separation unit configured to separate the sheet from the image bearing member, or a toner charge member configured to charge the toner.

21. The apparatus according to claim 20, further comprising an intermediate transfer member configured to bear a toner image;
   a primary transfer unit configured to primarily transfer a toner image formed on the image bearing member onto the intermediate transfer member; and
   a secondary transfer unit configured to secondarily transfer the toner image primarily transferred to the intermediate transfer member onto a sheet,
   wherein the image forming unit includes the primary transfer unit or the secondary transfer unit.

22. The image forming apparatus according to claim 15, wherein the contact portion is positioned at a portion where the second conductive member contacts the first conductive member on the side of the edge surface of the printed board of the first conductive member.

23. The image forming apparatus according to claim 15, wherein, in a state where the second conductive member contacts the contact portion, the second conductive member provides a first pressure in a direction perpendicular to a surface of the printed board, a second pressure in a direction parallel to the surface of the printed board, and a third pressure in a direction angled with the directions perpendicular and parallel to the surface of the printed board, to the first conductive member.

* * * * *